(12) United States Patent
Xie

(10) Patent No.: US 7,779,883 B2
(45) Date of Patent: Aug. 24, 2010

(54) SYSTEM FOR CONTROLLING NUCLEATION IN SELF-ASSEMBLED FILMS

(75) Inventor: Ya-Hong Xie, Beverly Hills, CA (US)

(73) Assignee: The Regents of the University of California, Oakland, CA (US)

( * ) Notice: Subject to any disclaimer, the term of this patent is extended or adjusted under 35 U.S.C. 154(b) by 551 days.

(21) Appl. No.: 11/468,711

(22) Filed: Aug. 30, 2006

(65) Prior Publication Data

US 2007/0077359 A1    Apr. 5, 2007

Related U.S. Application Data

(62) Division of application No. 11/168,266, filed on Jun. 27, 2005, now Pat. No. 7,118,784.

(51) Int. Cl.
    *B32B 37/00* (2006.01)
(52) U.S. Cl. ...................... 156/499; 156/538
(58) Field of Classification Search .......... 156/499, 156/580, 581, 583.1, 583.5, 538
    See application file for complete search history.

(56) References Cited

U.S. PATENT DOCUMENTS

| | | | | |
|---|---|---|---|---|
| 3,883,369 A | * | 5/1975 | Badger et al. | ............... 29/623.1 |
| 5,213,819 A | * | 5/1993 | Bielfeldt | ................... 425/371 |
| 5,948,470 A | | 9/1999 | Harrison et al. | |
| 6,159,334 A | * | 12/2000 | Uno | ...................... 156/583.5 |
| 6,893,705 B2 | | 5/2005 | Thomas et al. | |
| 2002/0055239 A1 | | 5/2002 | Tuominen et al. | |
| 2003/0118800 A1 | | 6/2003 | Thomas et al. | |

OTHER PUBLICATIONS

PCT International Search Report for PCT/US2005/022659, Applicant: The Regents of the University of California, Forms PCT/ISA/220 and 210 dated Dec. 23, 2005 (5 pages).
PCT Written Opinion of the International Search Authority for PCT/US2005/022659, Applicant: The Regents of the University of California, Form PCT/ISA/237, dated Dec. 23, 2005 (6 pages).
PCT International Preliminary Report on Patentability for PCT/US2005/022659, Applicant: The Regents of the University of California, Form PCT/IB/326, dated Jan. 17, 2008 (6 pages).
Mansky et al., Appl. Phys. Lett., 68(18), pp. 2586-2588 (1986).
Muthukuma et al., Science, 277, pp. 1225-1231 (1997).
Kim at al., Macromolecules, 31, pp. 2569-2577 (1998).
Mansky at al., Jornal of Materials Science, 30, pp. 1987-1992 (1995).
Harrison et al., Lithography with a Mask of Block Copolymer Microstructures, J.Vac. Sci. Technolo., B16, p. 544 (1998).

(Continued)

*Primary Examiner*—James Sells
(74) *Attorney, Agent, or Firm*—Vista IP Law Group LLP

(57) ABSTRACT

A device for forming a self-assembled film on a substrate containing a film precursor includes a first heating member and a second heating member disposed adjacent to the first heating member, the second heating member being separated from the first heating member by a gap. The device includes a movable pusher member configured for advancing the substrate from the first heating member to the second heating member.

22 Claims, 5 Drawing Sheets

OTHER PUBLICATIONS

Hashimoto et al., Macromolecules, 32, pp. 952-954 (1999).
De Rosa et al., Nature, 405, pp. 433-437 (2000).
Lin et al., Advanced Materials, 14(19), pp. 1373-1376 (2002).
S. Elhadj, et al., Orientation of Self-Assembled Block Copolymer Cylinders.., Appl. Phys. Lett., Feb. 10, 2003, pp. 871-3, vol. 82 No. 8, AIP.
Ross at al., Nanostructured Surfaces with Long-Range Order for Controlled Self-Assembly, NSF Nanoscale Science and Eng. Grantees Conf., Dec. 16-18, 2003.
C.A. Ross at al., Block Copolymer Lithography, 2003 Materials Research at MIT.

* cited by examiner

SYSTEM FOR CONTROLLING NUCLEATION IN SELF-ASSEMBLED FILMS

REFERENCE TO RELATED APPLICATION

This Application is a divisional Application of U.S. patent application Ser. No. 11/168,266 filed on Jun. 27, 2005, now issued as U.S. Pat. No. 7,118,784. Priority is claimed under 35 U.S.C. §§120 and 121. The above-identified U.S. Patent Application is incorporated by reference as if set forth fully herein.

FIELD OF THE INVENTION

The field of the invention generally relates to self-assembled nano-structured films. More particularly, the field of the invention relates to methods and processes used to control the nucleation in the self-assembly of nano-structured films.

BACKGROUND OF THE INVENTION

The semiconductor industry is increasingly being driven to decrease the size of semiconductor devices located on integrated circuits. For example, miniaturization is needed to accommodate the increasing density of circuits necessary for today's semiconductor products. Increased packing density and device size reduction has forced semiconductor device structures such as, for instance, transistors to be located ever closer to one another.

Unfortunately, conventional techniques of reducing component size will soon be reaching their limits. For example, conventional photolithography suffers from the diffraction limit and, consequently, cannot define patterns generally smaller than 100 nm. Advancements in lithographic methods such as e-beam lithography have been able create features as small as 10 nm. However, e-beam lithography is a sequential process and suffers from low throughput. Thus, e-beam lithography is not well suited for commercial applications which necessarily require high throughput.

As the trend toward miniaturization continues, the size of features in semiconductor-based devices will be on the nanometer scale. Features may be formed from molecules or even single atoms. The problem is that the precise location of molecules or atoms on a substrate is difficult to control. Control of the precise location of features on a substrate has been essential, however, in CMOS-based processes. Conventional CMOS-based process require precise registration of features over an entire substrate. Such substrates can be particularly large, for example, having diameters as large as 12 inches. Any new process for forming semiconductor-based features needs to preserve this precision on the wafer scale in order to make the process commercially feasible.

The barrier to nanometer scale lithography has given rise to attempts to use self-assembled molecules as a potential means to form nano-scale structures on a substrate. These techniques generally involve block copolymer or protein crystals with unit cell dimensions being on the order of nanometers. A subsequent step, which may take the form of an etching step, is used to transfer the formed pattern onto the substrate or overlying layer as in conventional photolithographic processes. One challenge, intrinsic to all self-assembly processes, is the poly-crystalline nature of the resulting film. Because of the simultaneous or near-simultaneous nucleation of many ordered domains, also known as crystallites over the entire surface of the substrate, the poly-crystalline morphology cannot be avoided. The maximum grain size is on the order of 1 µm. Consequently, there is no long-range order in the resulting crystalline films as is generally required for CMOS-based technology.

Various attempts have been undertaken to increase the long-range order of self-assembled nano-structured surfaces. In one method, for example, the substrate on which the film is formed contains regular patterning. Patterning is carried out by topographically or chemically modulating a substrate using interference lithography. The periodically-modulated substrate then provides for long-range order to the self-organized system. In another method, graphoepitaxy is used to induce orientation and positional ordering of block copolymer through artificial surface patterning such as the grooves of a diffraction grating. See e.g., C. A. Ross et al., *Nanostructured Surfaces with Long-Range Order for Controlled Self-Assembly*, NSF Nanoscale Science and Eng. Grantees Conf., Dec. 16-18, 2003. In the latter process, well-ordered structures can reportedly be formed within the grooves of the grating.

Still others have attempted to use rapid solidification to orient block copolymer micro-domains. U.S. Patent Publication No. 2003/0118800 discloses such a process that uses rapid solidification from a solvent to form patterns of microdomains in thin films of block copolymer.

There remains a need for a method of controlling the nucleation of self-assembled thin films. Preferably, the method can be used to create long-range order over the entire surface of a substrate and not just in one or more micro-domains on the substrate. The method would advantageously have high throughput such that the method could be employed in commercial applications to create nano-scale structures.

SUMMARY OF THE INVENTION

In one aspect of the invention, a method of forming a self-assembled crystalline film on a substrate includes the steps of providing film precursors on the substrate, wherein the film precursors are maintained in an amorphous state. A heating member is provided adjacent to the substrate and the substrate and heating member are subject to relative motion between the two. By moving the heating member and/or substrate relative to one another, a portion of the film precursors on the substrate is heated above the glass transition temperature. The process continues until a 2D self-assembled crystalline film is formed on all or substantially all of the surface of the substrate. It is an object of the invention to maintain a single ordered domain across the entire wafer surface throughout the self-assembly process.

In one aspect of the invention, the heating member is stationary while the substrate is moved with respect to the stationary heating member. In an alternative aspect of the invention, the substrate is stationary while the heating member is moved with respect to the stationary substrate. In yet another alternative, the substrate and the heating member are both moving.

The method described above may be followed by one or more steps of selectively removing one species of the self-assembled crystalline film formed on the substrate.

In still another aspect of the invention, a method of forming a self-assembled crystalline film on a substrate includes the steps of providing a film precursor on a substrate. The film precursor may be maintained in an amorphous state. A dispensing member is provided above the substrate and contains a pH adjusting medium. The pH adjusting medium is dispensed onto the substrate. The pH adjusting medium promotes crystallization of the film precursor into a self-assembled film.

The method described above may be implemented with a film precursor in the form of a polymer or protein. In addition, the pH adjusting medium may contain a viscosity altering agent for the purpose of controlling the speed of spreading of the film precursor.

In still another aspect of the invention, a device for forming a self-assembled film on a substrate containing a film precursor includes first and second heating members. The second heating member is disposed adjacent to the first heating member. The second heating member is separated from the first heating member by a gap, which in one preferred aspect of the invention, is a v-shaped gap. A moveable pusher member is provided for advancing the substrate from the first heating member to the second heating member.

In one aspect of the device, the first heating member has a temperature above the order-disorder transition temperature ($T_{OD}$) of the film precursor while the second heating member has a temperature above the glass transition temperature ($T_{glass}$) of the film precursor but below $T_{OD}$.

In another aspect of the device, the first heating member has a temperature below the glass transition temperature ($T_{glass}$) of the film precursor while the second heating member has a temperature above the glass transition temperature ($T_{glass}$) of the film precursor but below $T_{OD}$.

It is an object of the invention to provide a method of forming nano-scale structures on a substrate. It is a further object of the invention to provide a method of forming self-assembled crystalline film on a substrate having long-range order across all or substantially all of the surface of the substrate. Advantageously, the methods may be used in commercial applications because of their high throughput capabilities. Additional objects of the invention are described below.

BRIEF DESCRIPTION OF THE DRAWINGS

FIG. 1C also illustrates the advancing front of self-assembled crystalline film.

DETAILED DESCRIPTION OF THE PREFERRED EMBODIMENTS

Figure 1A:
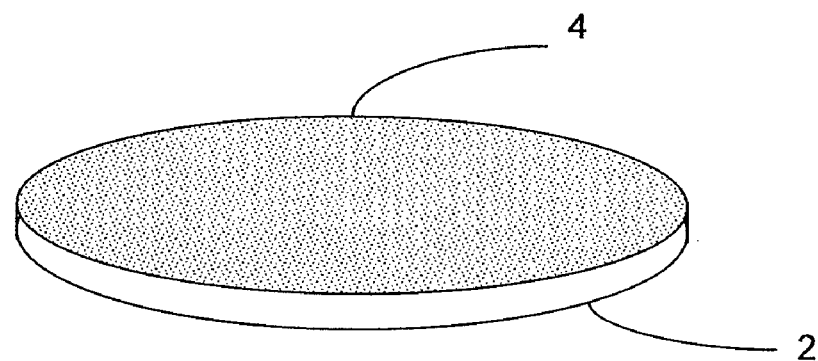
FIG. 1A illustrates a substrate such as, for example, a silicon substrate having a film (e.g., silicon dioxide) disposed on an upper surface thereof.

FIG. 1A illustrates a substrate 2 such as, for example, a silicon substrate 2 having an intermediate film 4 (e.g., silicon dioxide) disposed on an upper surface thereof. The substrate 2 may take the form of a wafer or the like which are commonly used to produced semiconductor devices. The substrate 2 may be formed, for example, from silicon, gallium arsenide (GaAs), gallium nitride (GaN), or the like. The composition of the intermediate film 4 may be selected, for example, based on its thermal conductivity level. Illustrate examples of intermediate films 4 include silicon dioxide ($SiO_2$), $SiN_x$, amorphous silicon, and metals such as aluminum and tungsten.

Figure 1B:
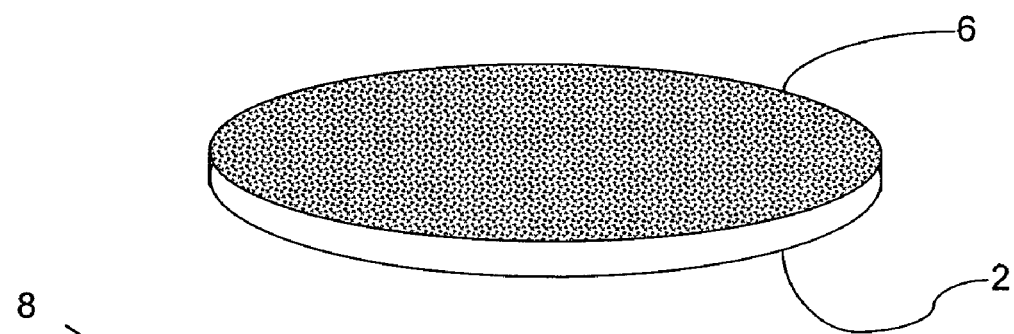
FIG. 1B illustrates the substrate of FIG. 1A having film precursors such as, for example, a di-block copolymer film disposed thereon.

Referring now to FIG. 1B, film precursors 6 are provided on the upper surface of the substrate 2. In one aspect of the method, the film precursors 6 include block copolymers. For example, the film precursors 6 may include a polyisoprene (PI)—polystyrene (PS) di-block copolymer (PI-PS). Another example of a block copolymer system includes poly(styrene-block-dimethylsiloxane) (P(S-b-DMS)). In this system, PDMS has a strong resistance to many types of reactive ion etch processes while polystyrene (PS) generally does not.

Still other block copolymer systems may be used in accordance with the methods contemplated herein. For example, systems where one component is degraded preferentially in response to radiation may be employed (e.g., polymethylmethacrylate (PMMA) is known to be degraded on exposure to an electron beam or ultraviolet light while polystyrene (PS) is more stable). Block copolymer systems can also be used where one component is susceptible to chemical treatments to alter etching rates. For instance, in a PS system incorporating polyisoprene (PI) or polybutadiene (PB), PS may be etched at a higher rate than either PI or PB when the system is exposed to osmium tetroxide ($OsO_4$) and later subject to $CF_4/O_2$ reactive ion etching. It should be understood that the methods described herein may be used with any number of block copolymer systems known to those skilled in the art. For example, block copolymers can be made with different lengths of individual polymers leading to different cluster sizes.

Referring back to FIG. 1B, the film precursors 6 may be disposed onto the substrate 2 by spin coating the film precursors 6 onto a substrate 2 containing the intermediate film 4. Alternatively, the film precursors 6 may be deposited on the substrate 2 by evaporation. For example, in one aspect of the method, a PI-PS di-block copolymer system may be spun on a substrate 2 covered with silicon dioxide. The film precursors 6 are maintained on the substrate 2 in an amorphous state (i.e., no formation of crystallites of any significant size). Generally, very small crystallites can easily reorient themselves to incorporate into a large crystallite nearby whereas large crystallites cannot because of the prohibitively high energy threshold. Thermal processes typically cannot overcome the high energy threshold levels required for large crystallites.

Figure 1C:
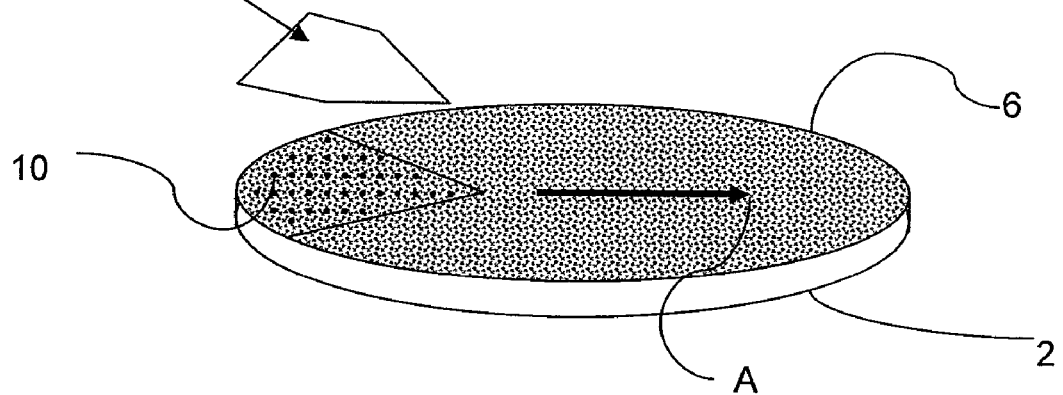
FIG. 1C illustrates the substrate of FIG. 1B with a moving heating member located above the upper surface of the substrate containing the film precursors.

Referring now to FIG. 1C, a heating member 8 is provided to heat a portion of the film precursors 6 above their glass transition temperature ($T_{glass}$). It is known that at temperatures above $T_{glass}$, the block copolymer phase segregates and the self assembled film 10 is composed of clusters of one of the polymers (e.g., PI spheres or balls) regularly distributed throughout a polymer matrix (e.g., PS matrix). See, e.g., C. Harrison et al., *Lithography With A Mask of Block Copolymer*

*Microstructures,* J. Vac. Sci. Technol., B16, p. 544 (1998). The above publication is incorporated by reference as if set forth fully herein.

As illustrated by a PI-PS di-block copolymer system, self-assembly into a 2D film 10 is driven by the interaction between the PI spheres or balls. If at any moment there is only a single crystal on the substrate 2 surface, film near the perimeter of the crystal (or nucleation site) will self-assemble into part of the growing 2D crystal film 10. If, however, the entire substrate 2 surface were heated at once, many crystallites form and grow simultaneously at different locations on the substrate 2. Unfortunately, the growth fronts from the various nucleation sites meet and result in an orientational mismatch that cannot be reconciled because it requires reorientation of the entire crystallite (which has a μm size). Consequently, there is no long-range order of resultant film. The present method overcomes this problem by propagating a moving front of a single domain of the self-assembled film 10—thereby avoiding simultaneous nucleation across the substrate 2 surface.

The heating member 8 may include an internal heating element (not shown) or be heated by some external source (e.g., heated by radiation or the like). In one aspect, the heating member 8 is in the form of a heated tip such as that shown in FIG. 1C. The heated tip generally includes an angled or triangular portion that terminates in pointed tip.

Relative movement is then initiated between the heating member 8 and the substrate 2. In a preferred embodiment of the method, the relative movement starts at one side or edge of the substrate 2 and progresses to an opposing side or edge. In this regard, the nucleation of a single two-dimensional (2D) self-assembled crystalline film 10 is controlled by the relative movement between the heating member 8 and substrate 2. In a preferred aspect of the invention, a moving front or region progresses across the surface of the substrate 2. In essence, nucleation of a single 2D crystalline film 10 is initiated at one point on the surface of the substrate 2 and is spread throughout the entire surface of the substrate 2. Preferably, the 2D crystalline film 10 may be formed in a single pass of the heating member 8 and/or substrate 2.

The heating member 8 is heated such that the film precursors 6 located adjacent to the heating member 8 are able to be heated to a temperature that exceeds $T_{glass}$. In this regard, only a portion of the film precursors 6 located adjacent to the heating member 8 are heated above $T_{glass}$.

Still referring to FIG. 1C, relative movement between the heating member 8 and the substrate 2 causes a front of self-assembled film 10 to move in the direction of arrow A. The front propagates across all or substantially all of the surface of the substrate 2. In one aspect of the invention, the heating member 8 is stationary while the substrate 2 is moved. In an alternative aspect of the method, the substrate 2 is stationary while the heating member 8 is moved.

Figure 2:
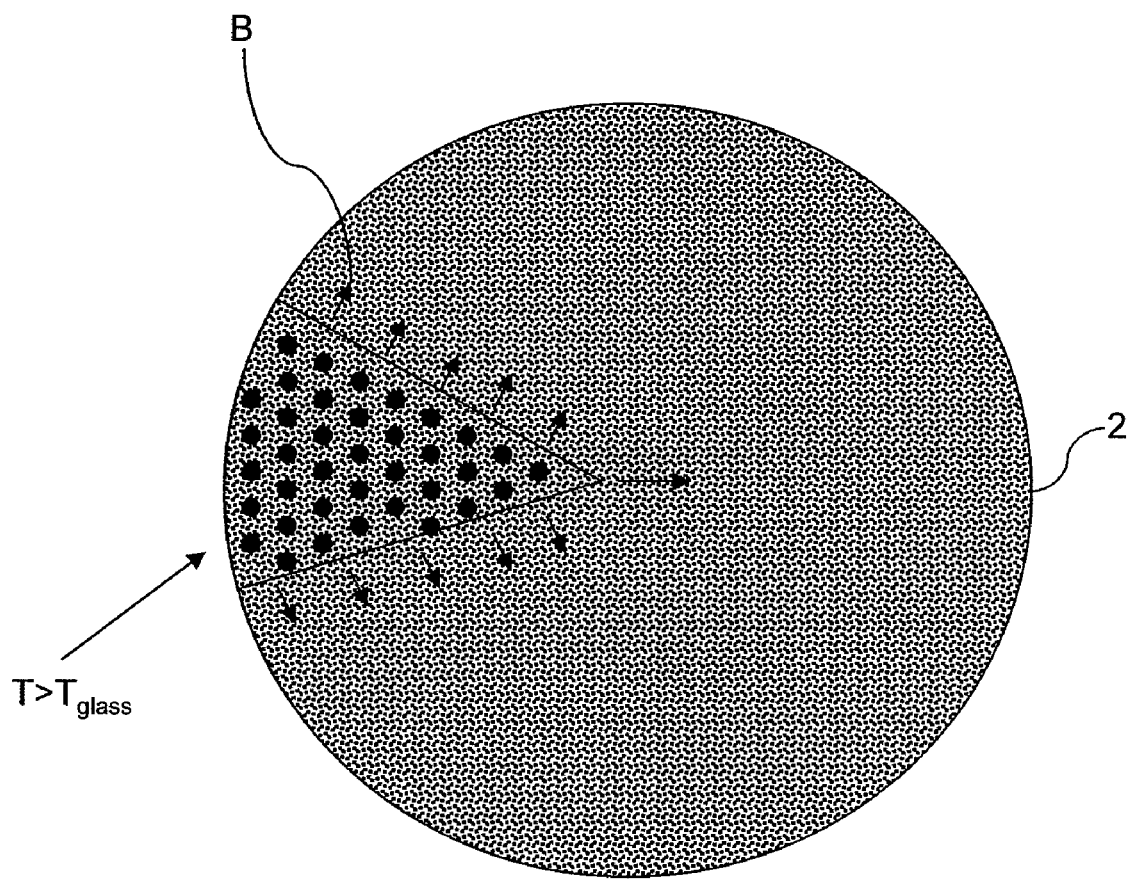
FIG. 2 illustrates a top down view of a substrate (with film precursors) showing the advancement of the self-assembled 2D crystalline region.

With reference now to FIG. 2, in a preferred aspect of the method, heat flow within the vicinity of the advancing front of self-assembled film 10 is limited to a value such that the width of the area just in front of the advancing front (represented by arrows B in FIG. 2) is less than or narrower than the range of interaction between adjacent PI balls or spheres. Generally, the method works best with a large or steep temperature gradient along the surface of the substrate 2. If the width of the elevated temperature field is too large, nucleation of the film 10 may result too far beyond the advancing front—thereby causing multiple polycrystalline micro-domains.

Figure 3:
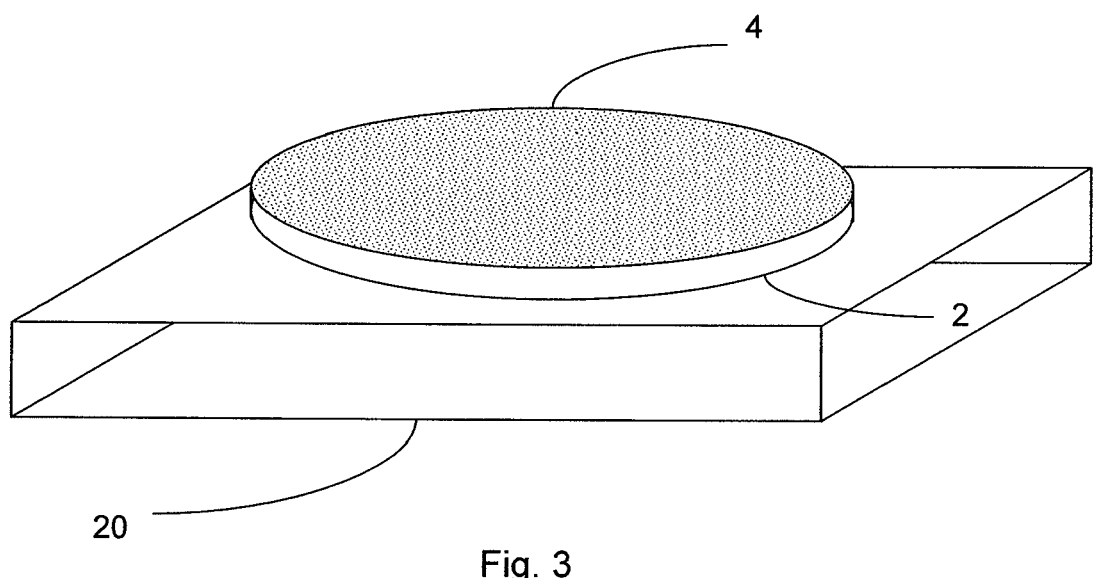
FIG. 3 illustrates a substrate being disposed on a thermal backing material such as, for example, a thermal reservoir or heat sink.

In one aspect of the invention, the width and steepness of the temperature gradient created on the surface of the substrate 2 may be controlled by the heat transfer properties of the substrate 2. For example, the composition of the intermediate film 4 may be chosen to increase the gradient created on the layer of film precursors 6. Alternatively, as shown in FIG. 3, the backside of the substrate 2 may be placed in thermal contact with a thermal member 20 which may include, for example, a constant temperature thermal reservoir or heat sink.

Figure 5:
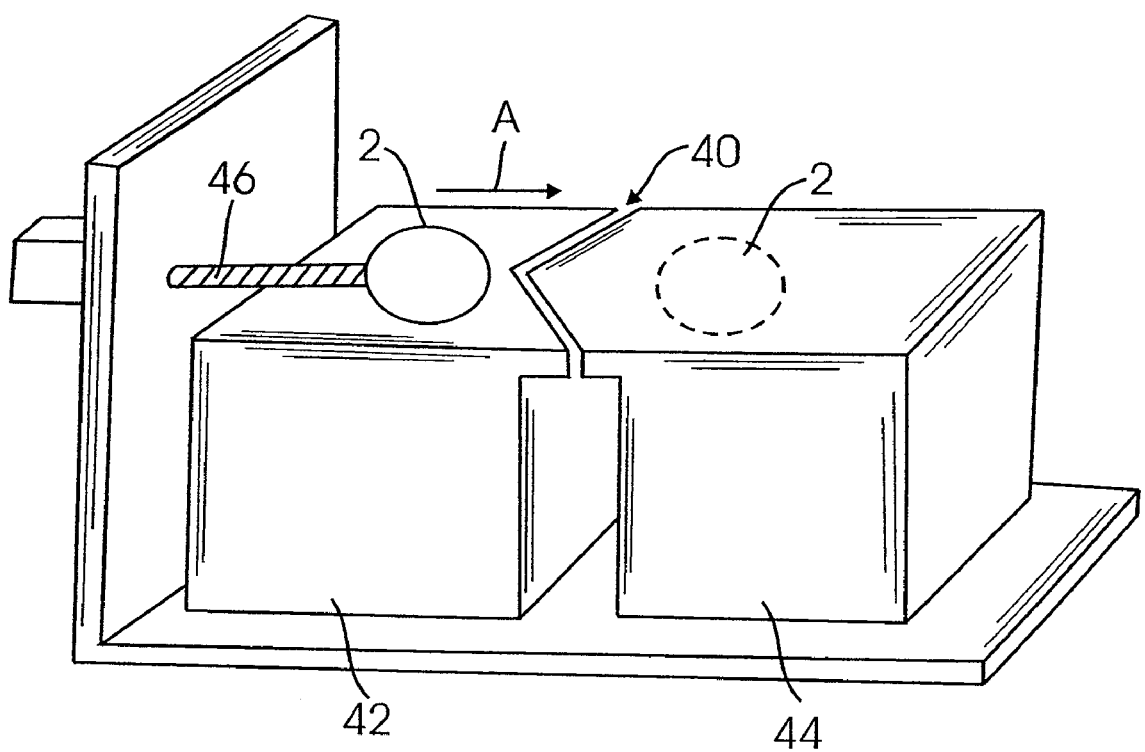
FIG. 5 illustrates two thermally conductive blocks or members used in an alternative self-assembly process.

An important requirement for the annealing set up is the ability of sustaining a steep temperature gradient. An alternative annealing set up is shown in FIG. 5, in which the precursor coated substrate 2 is in contact with and is moved across a gap 40 formed between two blocks 42, 44 of a thermally conductive material, for example, aluminum. The temperature of the two blocks 42, 44 can be maintained at, for example, above and below the $T_{glass}$ of the film precursor 6. Alternatively, the temperature of the two blocks 42, 44 can be maintained to be above and below $T_{OD}$, the order-disorder transition temperature. $T_{OD}$ is the temperature above which the entropy term dominates Gibb's free energy and the disordered state, as opposed to the ordered state, is favored thermodynamically.

As seen in FIG. 5, in one aspect of the process, the precursor coated substrate 2 is placed on a first heated block 42. The substrate 2 is then pushed in the direction of arrow A via a pusher member 46 across the v-shaped gap 40. The gap 40 between the first and second heated blocks 42, 44 is on the order of approximately 1 μm. In one aspect of the process, the first heated block 42 is maintained at a temperature above $T_{OD}$ while the second heated block 44 is maintained at a temperature above $T_{glass}$ but below $T_{OD}$. The two heated blocks 42, 44 may be maintained at different temperatures to maintain a temperature difference of about 50° C. between the respective upper contact surfaces of the heated blocks 42, 44. Self assembly takes place over the second heated block 44 and completes when the substrate 2 is completely pushed onto the second heated block 44.

The speed of relative movement between the substrate 2 and the heating member 8 is preferably controlled to fall below a threshold value which correlates to the speed of self-assembly of the 2D film 10. The relative speed should thus be slow enough for self-assembly to take place. At too high a rate, self-assembly of the film precursors 6 will not take place.

After forming the 2D self-assembled film 10 on all or substantially all of the surface of the substrate 2, the pattern may then be transferred to the intermediate film 4 and/or substrate 2. For example, the intermediate film 4 may be patterned using reactive ion etching techniques followed by subsequent removal of the remaining polymer film 10.

As one illustrative example, in a PI-PS di-block copolymer system, the substrate 2 containing the 2D self-assembled film 10 can be subject to a vacuum annealing process which forms spherical domains (PI spheres) in the self-assembled film 10. The PI spheres can then be selectively removed by ozone treatment. The voids may then be exposed by subjecting the substrate 2 to $CF_4$ reactive ion etching or $CF_4/O_2$ reactive ion etching. U.S. Pat. No. 5,948,470, which is incorporated by reference as if set forth fully herein, describes such a process to selectively degrade and remove components of block copolymers. In addition, a wet chemical pattern transfer process (or other process known to those skilled in the art) may be used to transfer the pattern into the substrate 2.

Figure 1D:
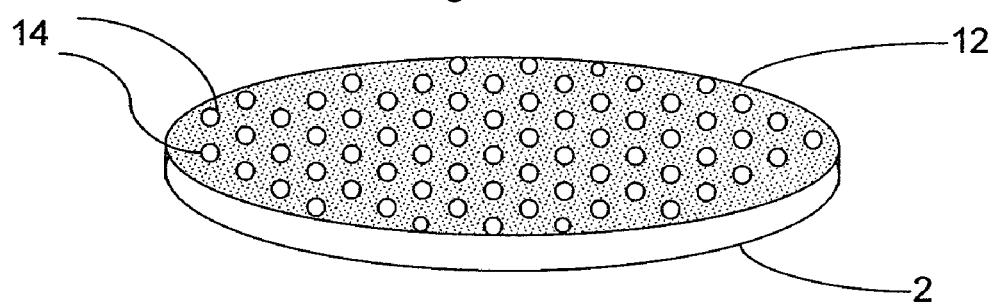
FIG. 1D illustrates a substrate having a self-assembled di-block copolymer film consisting of a single grain pattern of holes. The diameter of the holes and the period of the pattern (crystal) are determined by the lengths of the two polymer blocks of the copolymer. The length is typically on the order of about 10 nm.

FIG. 1D illustrates a substrate 2 having a silicon dioxide mask 12 with a single grain pattern of holes 14. The pattern of holes 14 may then be used to grow a variety of devices or components that are registered with the substrate 2 with nanometer precision. The holes 14 provide a framework or foundation on which subsequent processes can be based to form nano-scale structures.

Figure 4:
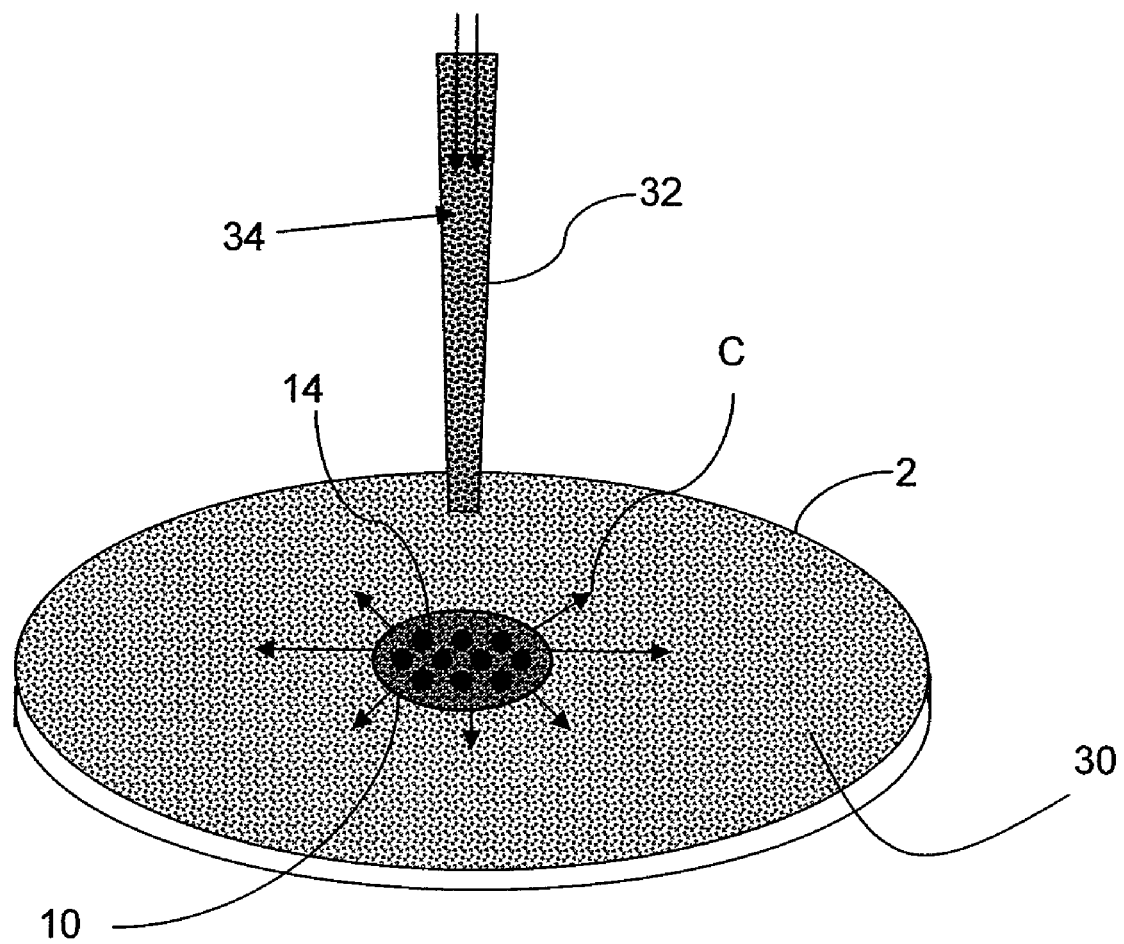
FIG. 4 illustrates an alternative aspect of the invention wherein a dispensing member containing a pH adjusting medium is used to promote crystallization of a biological (e.g., protein) film precursor into a self-assembled film.

FIG. 4 illustrates an alternative process used to form 2D self-assembled films 10. In FIG. 4, the substrate 2 is covered with a film precursor 30 which may take the form of a biological-based precursor such as a protein. In one aspect of the invention, the protein (or other precursor) self-assembles into a film 10 upon exposure to an appropriate chemical environment. For example, the protein may crystallize above or below a particular pH. The film precursor 30 is preferably maintained on the substrate 2 in an amorphous state as described above. A dispensing member 32 is provided above the surface of the substrate 2. The dispensing member 32 may take the form of a dropper, pipette, or micro-pipette for example. The dispensing member 32 includes therein or is otherwise connected to source of a pH adjusting medium 34. The pH adjusting medium 34 may comprise an acid, base, or even buffered solution. The pH adjusting medium 34 is chosen to promote the self-assembly or crystallization of the film precursor 30 into a self-assembled film 10.

As seen in FIG. 4, the pH adjusting medium 34 is dispensed from the dispensing member 32 onto the surface of the substrate 2. Preferably, the pH adjusting medium 34 is released in a controlled rate such that an advancing front of the pH adjusting medium 34 causes the self-assembly of the film precursor 30. Preferably, the speed of the advancement of the perimeter of the deposited pH adjusting medium 34 (represented by arrows C in FIG. 4) is low enough to permit the ordered crystallization of the film precursor 30. In one aspect of the process, a viscosity altering agent is added to the pH adjusting medium 34. The viscosity altering agent may include a viscosity enhancing agent (to increase viscosity) or a viscosity reducing agent (to decrease viscosity). The viscosity altering agent preferably slows or accelerates the speed at which the front of the pH adjusting medium 34 travels across the surface of the substrate 2. Alternatively, the wetting property of the film precursor 30 may be altered to adjust the speed at which the pH adjusting medium 34 flows.

In a preferred aspect of the invention, the pH adjusting medium 34 is dispensed in a central region of the substrate 2, as is shown in FIG. 4. Preferably, the pH adjusting medium 34 naturally flows outwardly toward the edges of the substrate 2. In an alternative embodiment of the invention, the substrate 2 may be rotated to assist the movement of the pH adjusting medium 34 across the surface of the substrate 2.

While embodiments of the present invention have been shown and described, various modifications may be made without departing from the scope of the present invention. The invention, therefore, should not be limited, except to the following claims, and their equivalents.

What is claimed is:

1. A system for forming a self-assembled film on a semiconductor substrate containing a film precursor comprising:
   a semiconductor substrate having a lower surface and an upper surface, the upper surface containing the film precursor;
   a first heating member, the first heating member having an upper surface configured to directly contact the lower surface of the semiconductor substrate;
   a second heating member disposed adjacent to the first heating member, the second heating member having an upper surface and being separated from the first heating member by a gap; and
   a moveable pusher member configured to advance the semiconductor substrate from the first heating member to the second heating member by sliding the semiconductor substrate directly over the upper surface of the first heating member, across the gap, and directly over the upper surface of the second heating member.

2. The system of claim 1, wherein the first heating member comprises a heating element configured to reach a temperature above the order-disorder transition temperature ($T_{OD}$) of the film precursor while the second heating member comprises a heating element configured to reach a temperature above the glass transition temperature ($T_{glass}$) of the film precuser but below $T_{OD}$.

3. The system of claim 1, wherein the gap is a v-shaped gap.

4. The system of claim 1, wherein the gap is on the order of 1 µm.

5. The system of claim 1, wherein the heating element of the first heating member and the heating element of the second heating member are configured to maintain a temperature differential of around 50° C. between an upper contact surface of the first heating member and an upper contact surface of the second heating member.

6. The system of claim 1, wherein the semiconductor substrate comprises a wafer.

7. The system of claim 6, wherein the semiconductor substrate comprises silicon.

8. The system of claim 1, wherein the film precursor comprises block copolymers.

9. The system of claim 8, wherein the film precursor comprises polyisoprene (PI)-polystyrene (PS) di-block copolymer (PI-PS).

10. The system of claim 8, wherein the film precursor comprises poly(styrene-block-dimethylsiloxane) (P(S-b-DMS)).

11. The system of claim 8, wherein the film precursor comprises polymethylmethacrylate (PMMA)-polystyrene (PS).

12. The system of claim 8, wherein the film precursor comprises polybutadiene (PB)-polystyrene (PS) di-block copolymer (PB-PS).

13. A system for forming a self-assembled film on a semiconductor substrate containing a film precursor comprising:
   a semiconductor substrate having a lower surface and an upper surface, the upper surface containing the film precursor;
   a first heated block having an upper surface configured to directly contact the lower surface of the semiconductor substrate, the first heated block comprising a heating element configured for maintaining a first temperature;
   a second heated block having an upper surface and disposed adjacent to the first heated block, the second heated block being separated from the first heated block via a gap, the second heated block comprising a heating element configured for maintaining a second temperature that is lower that the first temperature; and
   a moveable pusher member configured to advance the semiconductor substrate from the upper surface of the first heating member to the upper surface of the second heating member by sliding the semiconductor substrate directly over the upper surface of the first heated block, across the gap, and directly over the upper surface of the second heated block.

14. The system of claim 13, wherein the gap is a v-shaped gap.

15. The system of claim 13, wherein the heating element of the first heating member has a temperature above the order-disorder transition temperature ($T_{OD}$) of the film precursor while the heating element of the second heating member has a temperature above the glass transition temperature ($T_{glass}$) of the film precursor but below $T_{OD}$.

16. The system of claim 13, wherein the first heated block and the second heated block are formed from a thermally conductive material.

17. The system of claim 13, wherein the film precursor comprises block copolymers.

18. A system for forming a self-assembled film on a semiconductor substrate containing a film precursor comprising:
- a semiconductor substrate having a lower surface and an upper surface, the upper surface containing the film precursor;
- a first heating means configured to directly support the lower surface of the semiconductor substrate on a surface thereof;
- a second heating means configured to support the lower surface of the semiconductor substrate on a surface thereof, the second heating means being separated from the first heating means via a gap; and
- a moveable pushing means configured to advance the semiconductor substrate from the surface of the first heating means to the surface of the second heating means by sliding the semiconductor substrate directly over the upper surface of the first heating means, across the gap, and directly over the upper surface of the second heating means.

19. The system of claim 18, wherein the first heating means comprises a heating element having a temperature above the order-disorder transition temperature ($T_{OD}$) of the film precursor while the second heating means comprises a heating element having a temperature above the glass transition temperature ($T_{glass}$) of the film precursor but below $T_{OD}$.

20. A system for forming a self-assembled film on a semiconductor substrate containing a film precursor comprising:
- a first heating member;
- a second heating member disposed adjacent to the first heating member, the second heating member being separated from the first heating member by a v-shaped gap; and
- a moveable pusher member configured to advance the semiconductor substrate from the first heating member to the second heating member by sliding the semiconductor substrate directly over the upper surface of the first heating member, across the v-shaped gap, and directly over the upper surface of the second heating member.

21. A system for forming a self-assembled film on a semiconductor substrate containing a film precursor comprising:
- a first heating member;
- a second heating member disposed adjacent to the first heating member, the second heating member being separated from the first heating member by a gap on the order of 1 µm; and
- a moveable pusher member configured to advance the semiconductor substrate from the first heating member to the second heating member by sliding the semiconductor substrate directly over the upper surface of the first heating member, across the gap, and directly over the upper surface of the second heating member.

22. A system for forming a self-assembled film on a semiconductor substrate containing a film precursor comprising:
- a first heated block having an upper surface, the first heated block configured for maintaining a first temperature;
- a second heated block having an upper surface and disposed adjacent to the first heated block, the second heated block being separated from the first heated block via a v-shaped gap, the second heated block configured for maintaining a second temperature that is lower that the first temperature; and
- a moveable pusher member configured to advance the semiconductor substrate from the upper surface of the first heating member to the upper surface of the second heating member by sliding the semiconductor substrate directly over the upper surface of the first heated block, across the v-shaped gap, and directly over the upper surface of the second heated block.

* * * * *